United States Patent [19]

Kitagawa

[11] Patent Number: 4,679,071

[45] Date of Patent: Jul. 7, 1987

[54] METHOD OF RECORDING REGISTER MARKS

[75] Inventor: Osamu Kitagawa, Osaka, Japan

[73] Assignee: Dainippon Screen Manufacturing Co., Ltd., Japan

[21] Appl. No.: 919,254

[22] Filed: Oct. 15, 1986

Related U.S. Application Data

[62] Division of Ser. No. 723,940, Apr. 16, 1985.

[30] Foreign Application Priority Data

Apr. 27, 1984 [JP] Japan .................................. 59-87214
May 31, 1984 [JP] Japan .................................. 59-112674

[51] Int. Cl.⁴ .............................................. H04N 1/46
[52] U.S. Cl. ...................................... 358/75; 101/181; 356/401
[58] Field of Search ......................... 358/75, 280, 296; 101/181; 356/401

[56] References Cited

U.S. PATENT DOCUMENTS

| | | | |
|---|---|---|---|
| 3,679,316 | 8/1972 | Boujon | 356/401 |
| 4,070,117 | 1/1978 | Johannsmeier | 356/401 |
| 4,167,677 | 9/1979 | Suzki | 356/401 |
| 4,408,885 | 10/1983 | Johannsmeier | 356/401 |
| 4,496,241 | 1/1985 | Mayer | 356/401 |
| 4,515,481 | 5/1985 | Yamada | 356/401 |
| 4,528,630 | 8/1985 | Sargent | 101/181 |
| 4,553,845 | 11/1985 | Kuroki | 356/401 |
| 4,568,189 | 2/1986 | Bass | 356/401 |
| 4,579,453 | 4/1986 | Makita | 356/401 |
| 4,595,295 | 6/1986 | Wilczynski | 356/401 |

FOREIGN PATENT DOCUMENTS 0123305 10/1984 European Pat. Off. ............ 101/181

Primary Examiner—Howard W. Britton
Attorney, Agent, or Firm—Brumbaugh, Graves, Donohue & Raymond

[57] ABSTRACT

A method of recording register marks by a color scanner for the respective color separation pictures, wherein the register marks are produced by positive and negative linear pictures, or alternatively, by positive linear picture having omitted portions, thereby performing the registering work in an exact and efficient manner.

3 Claims, 17 Drawing Figures

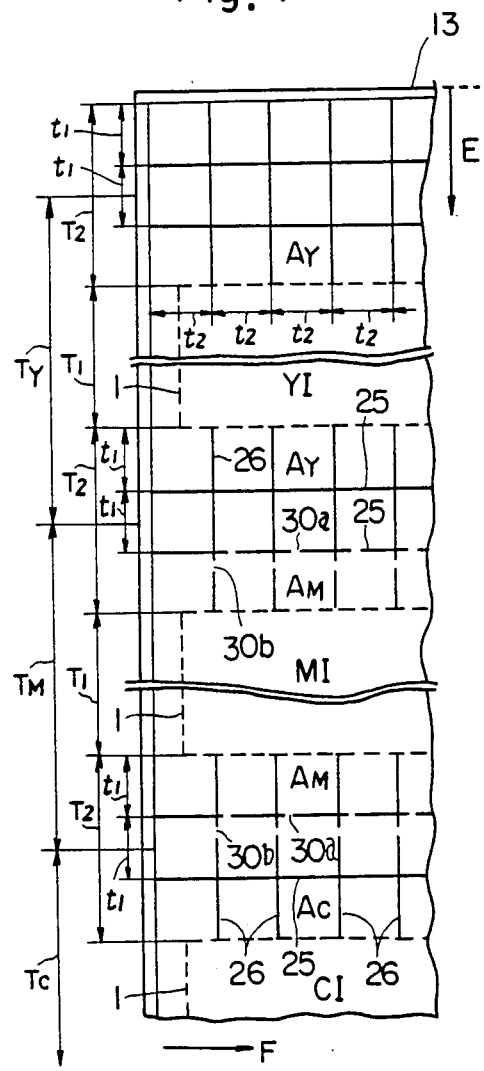

Fig. 14
Fig. 16
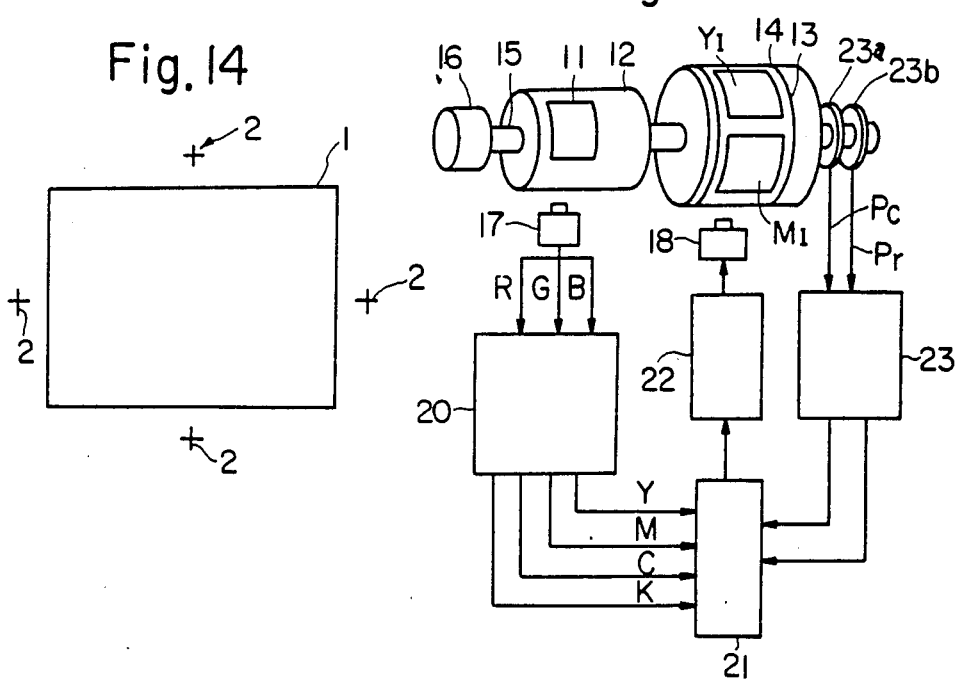
Fig. 15
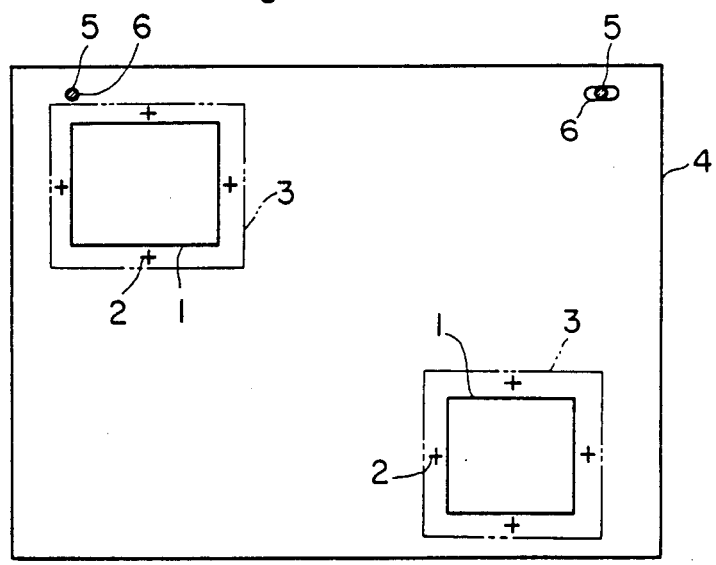

4,679,071

METHOD OF RECORDING REGISTER MARKS

This application is a division of application Ser. No. 723,940 filed on Apr. 16, 1985.

BACKGROUND OF THE INVENTION

The present invention relates to a method of recording register marks in a film on which color separation pictures are set, thereby locating the color separation pictures exactly. More particularly, the present invention relates to a method of recording such register marks in the film with the use of a color scanner.

It is known in the art that when color pictures are to be printed, the color separation of the original is carried out so as to produce yellow, magenta, cyan and black color plates, which are printed on the same paper in ink of the respective colors, thereby reproducing the original color pictures.

In such cases, it is necessary to register exactly the color separation plates, and if they are not exactly registered, non-alignment of color occurs in the print, thereby resulting in poor quality.

In order to secure a sharp and clear setting of color pictures in the print without non-alignment of colors, the registering of color separation plates is very important and, as shown in FIG. 15, the common practice is to prepare a transparent lay-out film 4 having a size corresponding to that of the plate to be processed, and provide pins 5 in openings 6 whereby the film is fixed. Then a color separation halftone positive 3 for the first color plate (usually a magenta plate) is adhered to the film 4 in accordance with the lay-out by an adhesive tape. When all the halftone positives 3 are printed, the operation is finished for the first color plate.

Then, a second transparent film 4 is firmly set by reference to the first color plate (i.e., the magenta plate), with the use of the pins 5, and a second color separation halftone positive 3 is printed after it is registered with the magenta halftone positive, thereby finishing the second operation with respect to the second color plate (e.g. cyan plate). Likewise, the printing is finished with respect to the third color (e.g. yellow) and the fourth color (e.g. black plate). When the second to fourth color pictures are registered with the reference first color ones, the cross-shaped register marks 2 can be used to secure the exact registering of color pictures.

The inventor made an invention relating to a method of recording register marks in color scanning for securing an exact registering of color pictures, which is disclosed in Japanese Patent Application Laid-Open No. 54-46602. As shown in FIG. 17, according to this method the cross-shaped register marks 24 are produced by the cross directional linear pictures 25 parallel with the subscanning direction, and the grain directional linear pictures 26 parallel with the main scanning direction, wherein the register marks are positive. In this way the register marks 24 are continuously and exactly recorded in a blank area T₂, i.e., outside the color separation pictures YI, MI, CI and KI.

However, under this previous method the register marks 24 of cross shape are positive throughout all the color separation plates, from which the following disadvantages have resulted:

Because of non-alignment, the line widths are likely to appear to be thicker or thinner than the actual widths; however, these apparent dimensional changes are apt to be overlooked, and an allowance for registering below the actual line widths of the register marks is often permitted. As a result, the operators must continuously pay utmost attention to the registering work, which is a heavy burden for them, and leads to inefficiency.

OBJECTS AND SUMMARY OF THE INVENTION

The present invention is directed to solving the problems pointed out above, and has for its object to provide a method of recording the register marks which ensures that a non-alignment thereof can be readily checked regardless of the fact that there occurs an apparent thickening or thinning of the line widths due to an inappropriate registering, thereby securing the efficient and exact registering of the register marks.

Other objects and advantages of the present invention will become more apparent from the following description when taken in connection with the accompanying drawings which show, for purposes of illustration only, one embodiment in accordance with the present invention.

In order to achieve the object mentioned above, according to one aspect of the present invention there is provided a method of recording register marks, which comprises:

a first step of producing a first group of picture signals in the cross direction parallel with the subscanning direction, and a second group of picture signals in the grain direction parallel with the main scanning direction, with the use of timing pulses;

a second step of producing positive linear picture signals by combining the first and second groups of signals;

a third step of recording by exposure register marks outside the reproducing picture area for the respective color separation picture, the area being hereinafter referred to as the blank area, by using the positive linear picture signals as register mark signals; and a fourth step of reversing the positive linear picture signals to produce negative linear picture signals, and of outputting the positive and negative linear picture signals selectively so as to produce register mark recording signals, thereby ensuring that the register marks are produced from the positive and negative linear pictures.

According to another aspect of the present invention, there is provided a method of recording register marks, which comprises:

a first step of producing a first group of picture signals in the cross direction parallel with the subscanning direction and a second group of picture signals in the grain direction parallel with the main scanning direction, with the use of timing pulses;

a second step of producing positive linear picture signals by combining the first and second groups of signals;

a third step of recording by exposure register marks outside the reproducing picture area for the respective color separation picture, the area being hereinafter referred to as the blank area, by using the positive linear picture signals as register mark signals; and a fourth step of producing the register mark recording signals by dividing the positive linear picture signals at a desired timing so as to produce omitted portions in the part thereof.

BRIEF DESCRIPTION OF THE DRAWINGS

FIG. 7 is a schematic view showing the register marks produced in Example 4;

FIG. 14 is a schematic view showing register marks known in the art for use in multicolor printing plates;

FIG. 15 is a plan view showing color separation films placed on a transparent lay-out film under the known methods;

FIG. 16 is a schematic view showing a color scanner to which the present invention is applied.

DETAILED DESCRIPTION OF THE PREFERRED EMBODIMENTS

Figure 1:
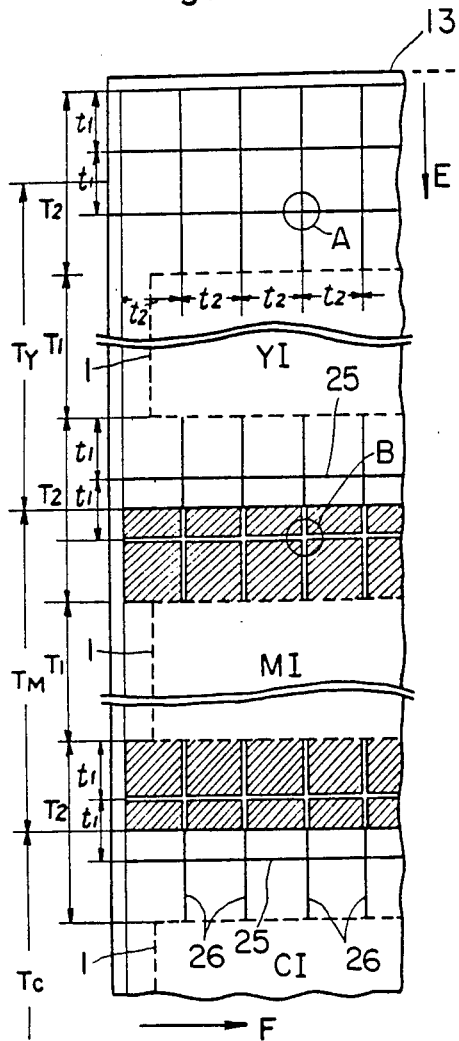
FIG. 1 is a schematic view showing the register marks produced in Example 1 according to the present invention.

Before entering into a description of the Examples, reference will be made to FIG. 16 to explain a color scanner to which the present invention is applied:

The reference numeral 12 designates a drum around which a color original 11 is placed. The reference numeral 14 designates a recording drum around which a recording film 13 is placed. The two drums 12 and 14 are driven by means of a common shaft 15, which is driven by a motor 16. The reference numeral 17 designates a pick-up head whereby the information about the pictures 11 is picked up. The reference numeral 18 designates a recording head whereby the pictures are recorded on the film 13. The pick-up head 17 is connected to a color and tone correction circuit 20, and the recording head 18 is connected to a driving circuit 22. The picture signals R, G and B are corrected in color and tone through the circuit 20. The reference numeral 21 designates a memory. The reference numerals 23a and 23b designate rotary encoders which generate pulses Pr and Pc hereinbelow referred to, and the reference numeral 23 designates a timing pulse generator.

EXAMPLE 1

In FIG. 1, there are provided two register mark rows: one is a row A in which the marks are positive, and the other is a row B in which the marks are negative. The marks in the row A have transparent lines, whereas those in the row B have opaque lines, but in the illustrated example the widths of the two lines are equal.

Figure 2:
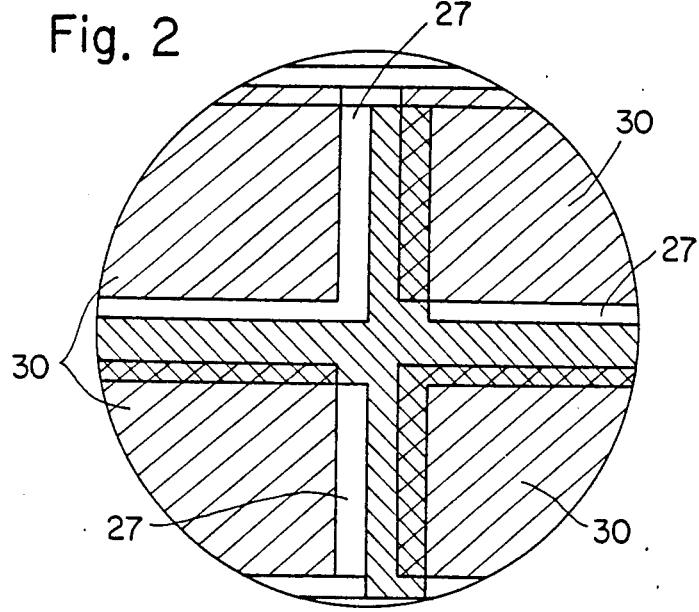
FIG. 2 is an enlarged view showing a state at which the portions A and B indicated in FIG. 1 are registered with each other.
Figure 6:
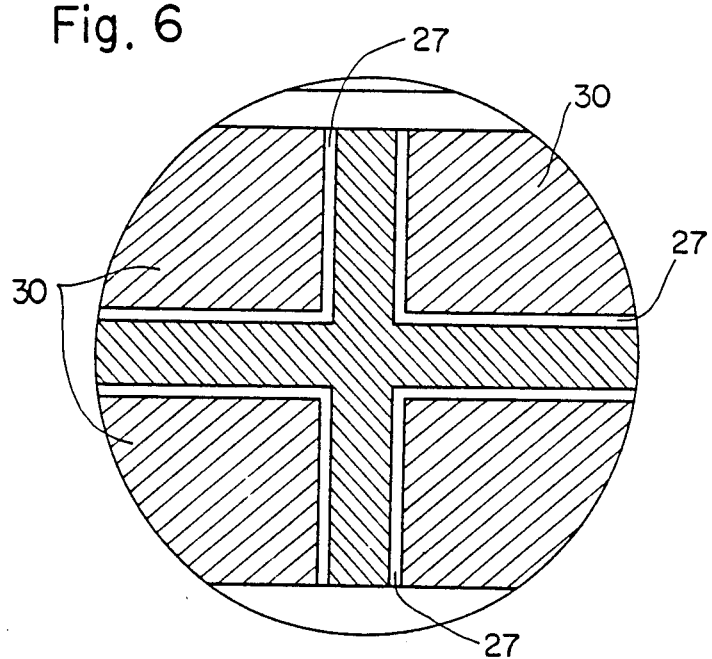
FIG. 6 is an enlarged view showing a state at which the register marks produced in Example 3 are registered with each other.

FIG. 2 shows a state at which the portions A and B of FIG. 1 are overlaid so as to achieve their registering. The reference numeral 27 designates a gap resulting from non-alignment. The registering must be conducted so as not to produce such a gap.

It will be apparent from FIG. 2 that to secure an exact registration of the positive and negative marks it is easier to use the positive and negative ones than the positive ones alone.

Figure 3:
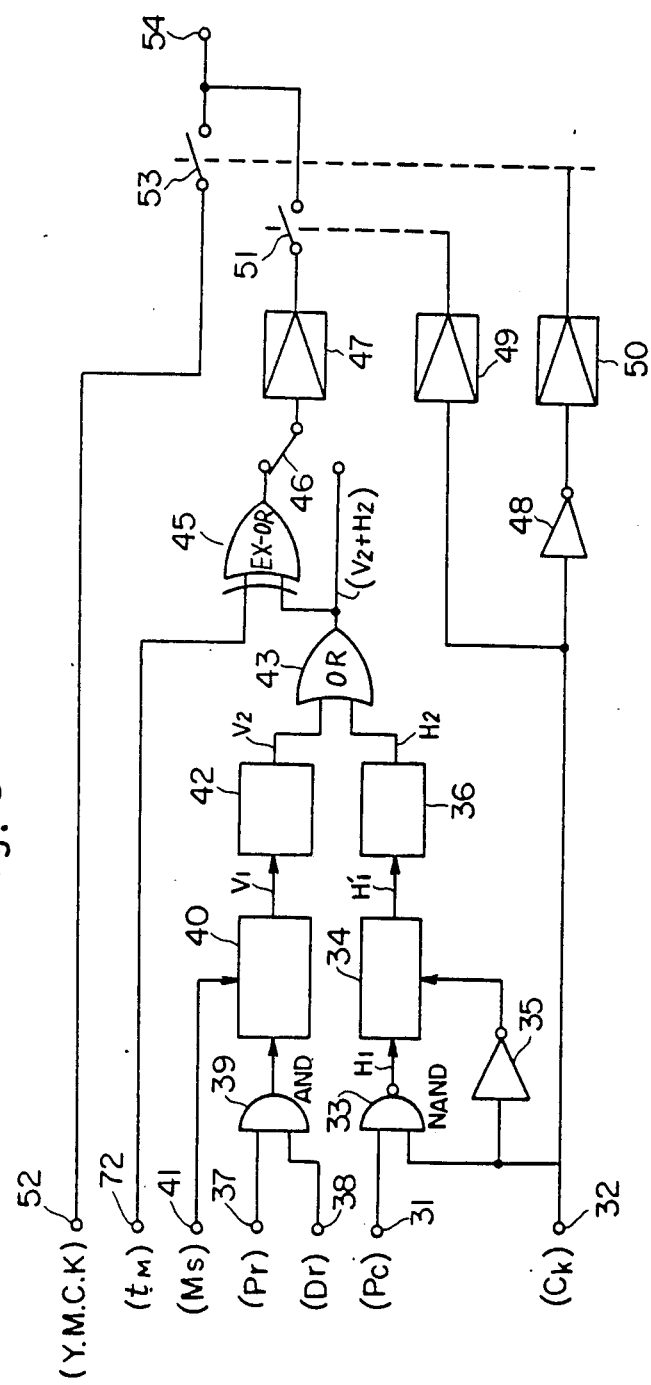
FIG. 3 is a circuit diagram showing a control system for Example 1.

FIG. 3 shows a circuit used for selecting the rows of positive and negative register marks, and recording the results for the respective color separation pictures.

The circuit will be described in greater detail:

A clock pulse Pc is input to a terminal 31, and a picture area scanning signal Ck of low level is input to a terminal 32 while a recording head 18 (FIG. 16) is scanning a picture recording area ($T_1$). The low level of the signal Ck is continuously output from when timing pulses are generated so as to read out color separation signals Y, M, C, and K through a memory 21 (FIG. 16) up to when another circuit (not shown) counts the number of timing pulses specified by the peripheral dimensions of the pictures.

The signals input to the terminals 31 and 32 are input to a NAND circuit 33, from which a pulse $H_1$ is output while the recording head 18 is scanning a blank area $T_2$. This pulse $H_1$ is input to a counter 34 for the next step.

The signal Ck is inverted into a pulse $\overline{Ck}$ through an inverter 35, which signal is input as a reset signal to the counter 34, thereby counting the input pulses $H_1$. Each time when a given number $N_1$ of pulses are input, the counter outputs a single pulse $H_{1a}$, which is input to a monostable multivibrator 36 whereby it is converted into a pulse signal $H_2$ having an amplitude sufficient to be input to an OR circuit 43. This modified signal $H_2$ is used for recording lines 25 in the subscanning direction F (FIG. 1).

There are provided a terminal 37 to which a one-rotary pulse Pr is input, and a terminal 38 to which a signal Dr is input, the signal Dr being generated while the recording head 18 is driven in the subscanning direction F. Both signals are input to an AND circuit 39. Thus, the AND circuit 39 generates a single pulse each rotation of the drum, which is input to a counter 40 for the next step.

There are provided position detectors, such as magnetic sensors, located in place along a path taken by the recording head 18, which outputs signals Ms to be input to a terminal 41. These input signals Ms are input to the counter 40 as reset signals. This enables the counter 40 to count the one-rotary signals from when the recording head 18 passes a certain point during the scanning stroke, and generate a signal $V_1$ having a single pulse each time when a desired number $N_2$ of pulses are counted. This pulse $V_1$ is input to a monostable multivibrator 42, and converted into a pulse signal $V_2$ having a desired amplitude, which is then input to an OR circuit 43. This signal $V_2$ is used for recording lines 26 in the main scanning direction F (FIG. 1).

As described above, the OR circuit 43 generates a signal ($H_2+V_2$), that is, an OR signal of $H_2$ and $V_2$. This signal is obtained by converting the signals generated by the counter 34 or 40 into pulses having a desired amplitude each time when they reach the desired number $N_1$ or $N_2$. Monostable multivibrators 36 and 42 are employed.

A feature of Example 1 resides in the fact that the pulse ($H_2+V_2$) is suitably inverted so as to provide an EX-OR circuit 45 for recording negative register marks.

A terminal 72 receives a signal $t_M$ corresponding to a magenta area $T_M$ or any other reference color separation plate, which signal is input to one of the terminals of the EX-OR circuit 45. An output signal ($H_2+V_2$) from the OR circuit 43 is input to the other terminal of the EX-OR circuit 45. When the signal $t_M$ is low, and when other color plates than the magenta plate are scanned, the output signal ($H_2+V_2$) from the OR circuit continues to be output thereby to record positive register marks. When the signal $t_M$ is high, and when the magenta plate is scanned, the output signal 102 from the EX-OR circuit 45 is read out as an inversed signal ($H_2+V_2$) thereby to be output to an output 54 through an amplifier 47 and a switch 51. In this way negative register marks are recorded in a blank area for the magenta plate.

A terminal 52 receives color separation picture signals Y, M, C, and K in succession from the memory 21 (FIG. 21), and in turn outputs these signals to the output terminal 54 through a switch 53.

The signal $C_k$ input to the terminal 32 controls the switch 51 through an amplifier 49, and also the switch 53 through an inverter 48 and an amplifier 50. This practice is, however, known in the art.

In this way color separation pictures are recorded for the picture recording area $T_1$, and register mark rows shown in FIG. 1 are recorded for the blank area $T_2$ by the signals from the EX-OR circuit 45.

The negative register marks indicated by B in FIG. 1 are formed by thin transparent lines drawn in the black background. Accordingly, when the positive register marks are overlaid thereon, the positions of the negative register marks will be undiscernible. To avoid such an inconvenience, the following practice illustrated as Example 2 is applicable.

EXAMPLE 2

Figure 4:
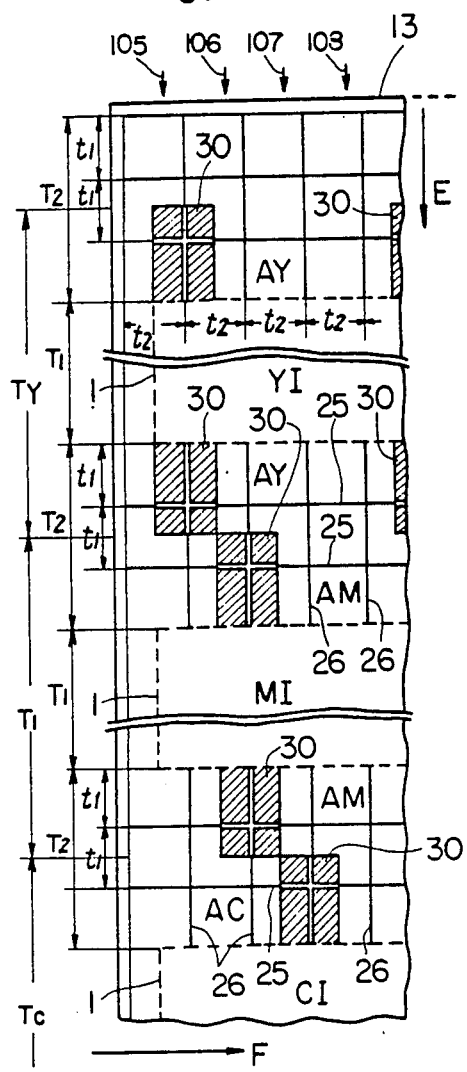
FIG. 4 is a schematic view showing the register marks produced in Example 2 according to the present invention.

In FIG. 4 a series of register marks are indicated by AY, AM, AC and AK (the AK is omitted), which are produced by the method of this Example. Each row, AY, AM, AC and AK shows that the AY lines are recorded before and after the yellow picture YI, and that the AM lines are before and after the magenta picture MI. The same is with each of the cyan and the black pictures. Each row has negative crosses 30 which are arranged such that their positional phases are differentiated with each color.

The two component lines are different in that one is transparent and the other is opaque, but their widths are the same. When a registering is to be carried out with the use of these register marks, it is not necessary to specify a register mark (accordingly, a reference color separation plate) for a reference register mark, unlike Example 1. Instead, it is possible to carry out an exact registration by using the marks alternately. The resulting registration will be equal to that shown in FIG. 2. If four plates are simultaneously overlaid, it is easy to carry out registering. This is a great advantage. Particularly, in Example 2 the problem of undiscernibleness is overcome. After register marks of a positive type are used to secure an exact registration, it is possible to use register marks of a positive and a negative type so as to ensure a more precise registration.

Figure 5:
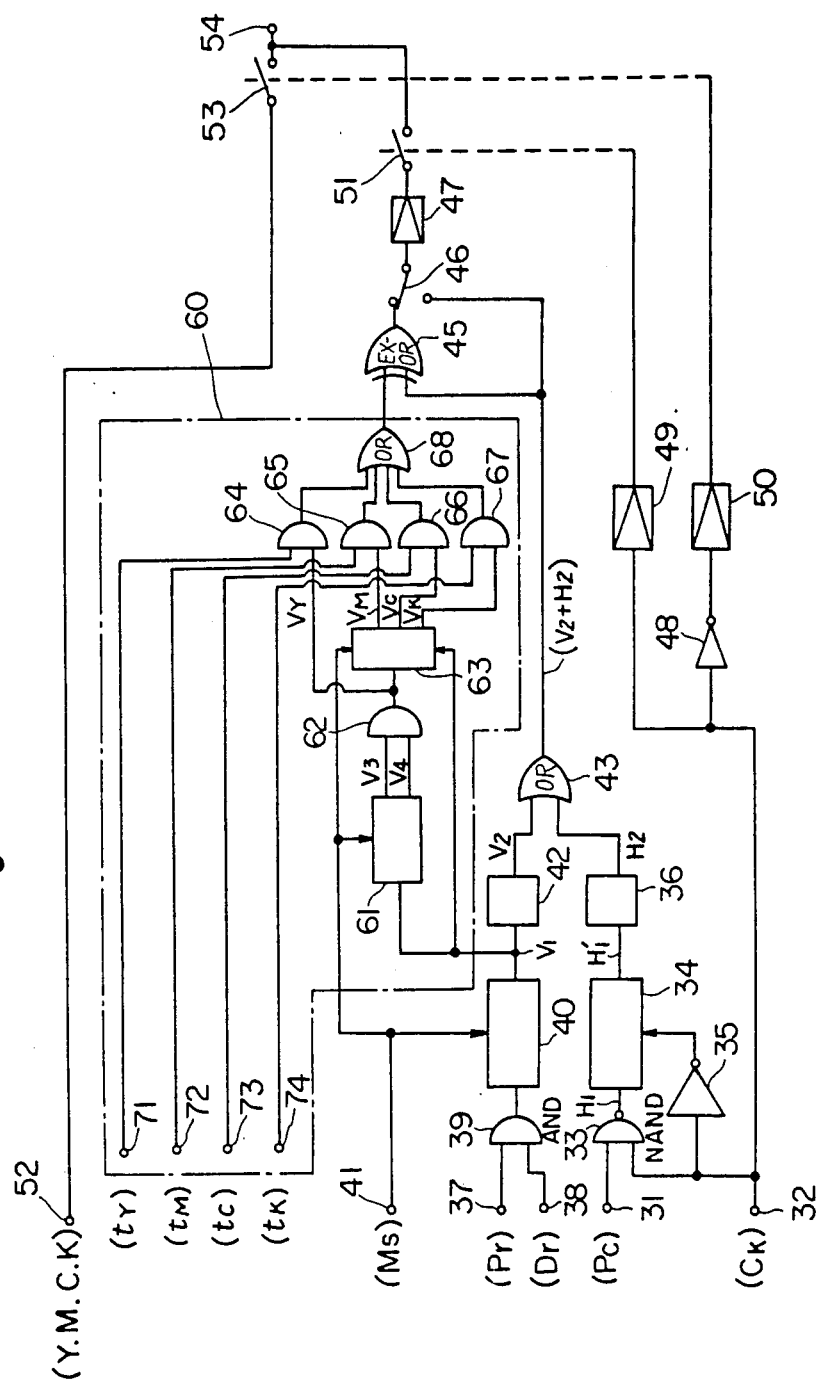
FIG. 5 is a circuit diagram showing a control system for Example 2.

FIG. 5 shows a circuit for use in recording the register mark rows in FIG. 4:

Like reference numerals are used in FIGS. 5 and 3 to designate like components and elements, of which a description is omitted for simplicity.

A feature of this example resides in the fact that each row AY, AM, AC and AK has crosses of a negative type located such that their positional phases are differentiated with each color, and that a switching means 60 and the EX-OR circuit 45 are provided for recording the crosses 30. The following description is given to clarify this feature:

The OR circuit 43 outputs pulses ($H_2+V_2$) having the pulse widths determined by the monostable multivibrator 36 or 42 based on the signals output when the predetermined number $N_1$ or $N_2$ of the input signals are counted by the counter 34 or 40.

The output signals $V_1$ from the counter 40 are also input to a counter 61 and a shift register 63. The start signal Ms input to a terminal 41 is input to the counters 40 and 61, and the shift register 63 as a reset signal.

The counter 61 outputs two kinds of signals, for example signals $V_3$ and $V_4$ obtained by dividing the pulse number of $V_1$ by ½ and ¼, and delaying them by a given pulse number from the start signal Ms (which corresponds to ½ of the pitch $t_2$ of the between the adjacent grain directional lines 26), and they are input to two input terminals of an AND circuit 62.

The shift register 63 outputs signals $V_M$, $V_C$, and $V_K$ in sequence which are delayed by a time corresponding to the $t_2$ pitch wherein the signal $V_M$ is delayed to an input signal $V_r$, the $V_C$ is to the $V_M$, and the $V_K$ is to the $V_C$.

In order to obtain such signals, a decoder can be effectively employed instead of using the AND gate 62 and the shift register 63.

A signal tr is input to a terminal 71 corresponding to the yellow plate area Tr, and is input to the AND circuit 64 together with the signals VY, from which a signal (tr·Vr) is output and input to one of the input terminals of an OR circuit 68.

A signal $t_M$ is input to a terminal 72 corresponding to the magenta plate area $t_M$, and is input to an AND circuit 65 together with the signal $V_M$, from which a signal ($t_M·V_M$) is output and input to one of the input terminals of the OR circuit 68.

A signal $t_C$ is input to a terminal 73 corresponding to the cyan plate area $T_C$, and is input to an AND circuit 66 together with the signal $V_C$, from which a signal ($t_C·V_C$) is output and input to the OR circuit 68.

A signal $t_K$ is input to a terminal 74 corresponding to the black plate area $T_K$, and is input to an AND circuit 67 together with the signal $V_K$, from which a signal ($t_K·V_K$) is output and input to the OR circuit 68.

In this way the OR circuit 68 outputs a signal ($t_r·V_r+t_M·V_M+t_C·V_C+t_K·V_K$).

When the output signal from the OR circuit 68 is low, the EX-OR circuit 45 outputs the signal ($V_2+H_2$), whereas when it is high, the circuit 45 outputs a reversed signal ($V_2+H_2$). Accordingly, when the point indicated by the arrow 105 in FIG. 4 is scanned, the signal ($V_2+H_2$) is initially output, and over the blanking period for the yellow the reversed signal ($V_2+H_2$) is output. Over the magenta and cyan blanking periods the signal ($V_2+H_2$) is again output.

When the point indicated by the arrow 106 is scanned, the signal ($V_2+H_2$) is respectively output over the yellow, cyan and black blanking periods, and over the magenta blanking period the reversed signal ($V_2+H_2$) is output.

The output signal is output to the recording signal output terminal 54 through the amplifier 47 and the switch 51. As described above, the color separation signals Y, M, C and K are input to the terminal 52, which are output to the output terminal 54 through the switch 54.

The same procedure as that for Example 1 will be taken, that is, as shown in FIG. 4 the color separation pictures are recorded in the respective picture recording areas, and the register marks corresponding to the color separation plates are recorded in the blank areas before and after the picture areas.

The positions and order of the negative crosses 30 in the register marks in FIG. 4 are selectively predetermined by a switch 60.

The advantage of Example 2 is that two or more plates are easily registered at one time.

EXAMPLE 3

In Examples 1 and 2 the width of lines of the positive and negative register marks are equally recorded. In contrast, in Example 3 the line width of negative register marks is symmetrically thickened in comparison with that of positive register marks. In Examples 1 and 2 if an over exposure occurs thereby to cause an unwanted thickening in either or both of the negative and positive register marks, it is no longer possible to secure the exact registration with the use of known register pins. In contrast, Example 3 secures it even in such situations because of the symmetrical thickened line width of the negative register marks in comparison with that of the positive register marks. This is the advantage of Example 3 over Examples 1 and 2.

The control circuit for recording negative register mark rows can be provided by modifying the circuit shown in FIG. 3, that is, by reducing the frequency dividing ratio of the counters 34 and 40, advancing the timing for triggering the monostable multivibrators 36 and 42 by a time corresponding to ½ of the length whereby the line widths are thickened, widening the pulse widths of the monostable multivibrators 36 and 42 by a time corresponding to the line width thickening length, and controlling by means of a gate circuit so that the number of pulses input to the counters 34 and 40 are appropriately reduced so as to keep the pitches of the register marks to be recorded equal to those of the positives. This modified circuit can be constituted by using a counter, a shift register and a gate circuit.

In the illustrated embodiment four kinds of color separation pictures are registered around the registering drum, but it is possible to register them color by color in one process.

In Example 1 shown in FIG. 1, the register mark rows are made up of negatives alone but, where necessary, it is possible to contain some positives. For example, it is possible to use register marks containing a mixture of negatives and positives shown in FIG. 4.

EXAMPLE 4

Figure 8:
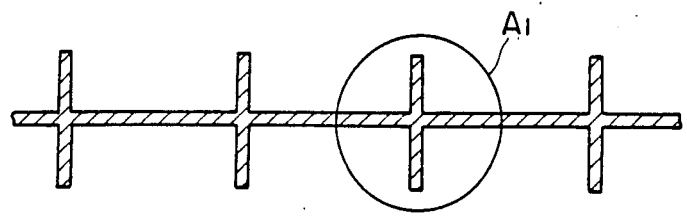
FIG. 8 is an enlarged view showing a positive register mark row shown in FIG. 7.
Figure 9:
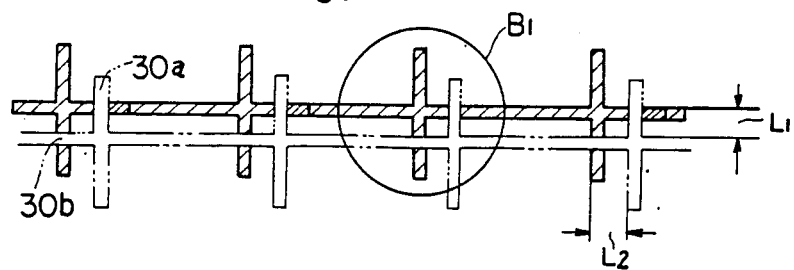
FIG. 9 is an enlarged view showing a register mark row having omitted portions at desired positions shown in FIG. 7.

Referring to FIG. 7, Example 4 will be described:

FIG. 7 is a schematic view showing register mark rows produced under Example 4, and FIGS. 8 and 9 are enlarged views showing the register mark rows in FIG. 7, the former showing those of the same positive type as that of prior art, and the latter showing the register mark rows having omitted portions at desired positions.

Figure 10:
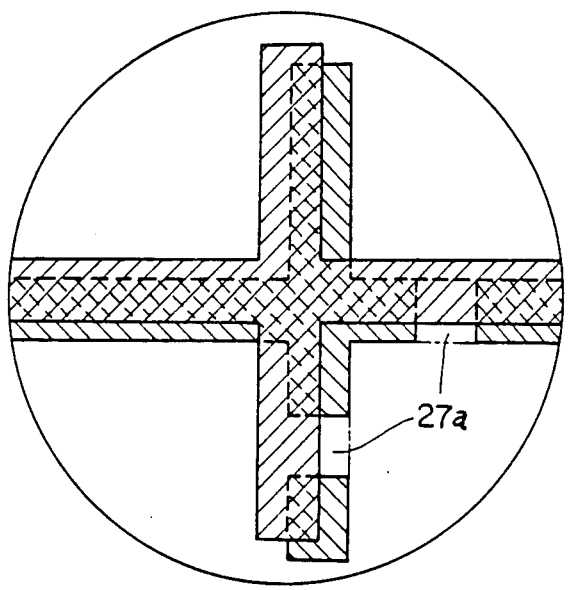
FIG. 10 is an enlarged view showing a state at which the portion $A_1$ in FIG. 8 and the portion $B_1$ in FIG. 9 are registered with each other.

As shown in FIG. 10, if two kinds of register marks are not exactly registered with each other, a blank portion 27a is produced, and therefore it is necessary to register the marks without causing such a blank. When no omitted portions 30a and 30b are provided, and if the white blank portion is smaller in amount than the width of the lines, it is difficult to recognize this blank portion partly because of the thickening of the lines of the register marks. However, when the omitted portions 30a and 30b are provided, it is easy to recognize it even if the blank portion is small.

Figure 11:
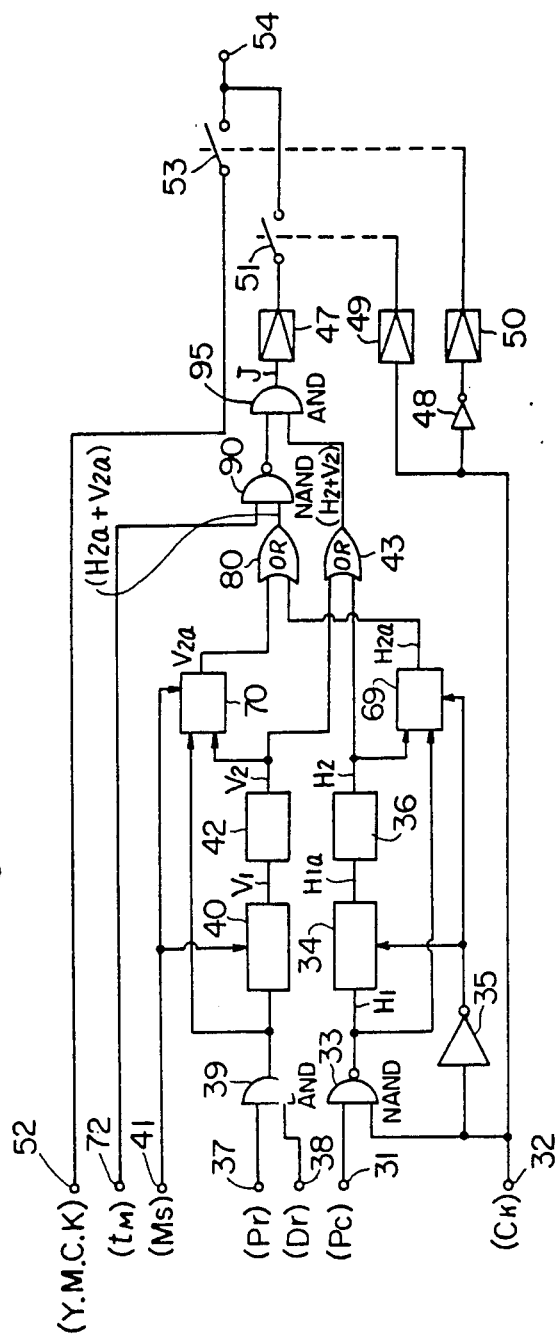
FIG. 11 is a circuit diagram showing a control system for Example 4.

Referring to FIG. 11, in which like reference numerals designate like elements and components designated by those in FIG. 3, a circuit for Example 4 will be described in detail:

The NAND circuit 33 outputs a pulse signal $H_1$ when a signal CK is high while the recording head 18 scans the blank area. The signal $H_1$ is input to the counter 34 and the shift register 69.

The low level of the signal CK is inverted to provide an inverted signal $\overline{CK}$ through the inverter 34, which is input to the counter 34 and the shift register 69 as a reset signal.

When the signal CK is high, the counter 34 counts the input pulse $H_1$, and outputs a pulse $H_{1a}$ each time when it receives a given number $N_1$ of pulses. The pulses $H_{1a}$ are individually input to the monostable multivibrator 36, where their pulse widths are converted into pulse signals $H_2$ having a desired pulse width at the falling point of time for the pulses. The pulse signals $H_2$ are input to the OR circuit 43 and the shift register 66. The pulse signal $H_2$ is used to record the lines 25 in the subscanning direction (the arrow direction F).

The AND circuit 39 outputs one pulse $P_r$ each rotation of the drum while the recording head 18 (FIG. 16) is driven, and the pulses are input to the counter 40 and a shift register 70.

A terminal 41 receives outputs $M_S$ from a positioning detector, such as a magnetic sensor, arranged in place along the moving path of the recording head 18. The input $M_S$ is input to the counter 40 and the shift register 70 as a reset signal.

The counter 40 counts pulses $P_r$ immediately after the recording head has passed a certain point in its scanning operation, and outputs one pulse signal $V_1$ each time when it counts a given number $N_2$ of pulses. This pulse signal $V_1$ is input to the monostable multivibrator 42, and its pulse width is converted into a pulse signal $V_2$ having a desired width at the falling point of the signal $V_1$. The signal $V_2$ is input to the OR circuit 43 and the shift register 70. This signal is used to record the lines 26 in the main scanning direction (the arrow direction E).

The OR circuit 43 outputs ($H_2+V_2$: the OR signal of the pulses $H_2$ and $V_2$) having a pulse width varied to the widths determined by the monostable multivibrators 36 or 42 each time when the counter 34 or 40 counts the desired number $N_1$ or $N_2$. This output signal ($H_2+V_2$) is used for a regular positive type of register mark.

The shift register 69 outputs a signal $H_{2a}$ at a timing corresponding to the $L_1$ in FIG. 9 against the signal $H_2$, the signal $H_{2a}$ being input to an OR circuit 80.

Likewise, the shift register 70 outputs a signal $V_{2a}$ at a timing corresponding to the $L_2$ in FIG. 9 against the signal $V_2$, the signal $V_{2a}$ being input to the OR circuit 80.

As a result, the OR circuit 80 outputs a signal $(H_{2a}+V_{2a})$ at a timing corresponding to the $L_1$ and the $L_2$ in the main scanning direction and the subscanning direction, respectively, against the signal $(H_2+V_2)$ output from the OR circuit 69. The signal $(H_{2a}+V_{2a})$ is input to one of the input terminals of a NAND circuit 90. The values of the $L_1$ and $L_2$ may be either equal or different.

A terminal 72 receives a signal $t_M$ corresponding to the magenta color area $T_M$, which is input to the other input terminal of the NAND circuit 90.

The NAND circuit 90 outputs a reversed signal $t_M \cdot (H_{2a}+V_{2a})$ for the AND signal of the signals $t_M$ and $(H_{2a}+V_{2a})$, which output signal is input to one of the input terminals of an AND circuit 95.

In this way the AND circuit 95 outputs the logical sum J of the signals $(H_2+V_2)$ and $t_M(H_{2a}+V_{2a})$. When this signal J is high, the positive register marks are recorded in their regular form, and when it is low, the output signal becomes low (the register mark recording signal is off), and the register marks having omitted portions corresponding to the line width (FIG. 9) are recorded, which signal J is output to the output terminal 54 through the amplifier 47 and the switch 51. It is desirable to add a further monostable multivibrator used to correct pulse widths, or to use a shift register having a plurality of output terminals and a gate circuit, thereby enlarging the omitted line width of the register marks so as to be thicker than the actual line width. This enlargement facilitates the registering.

As shown in FIG. 3, the picture signals (Y.M.C.K.) and the register mark signal J are output to the terminal 54 by switching the switches 53 and 51.

As shown in FIG. 7, the color separation pictures are selectively recorded for the picture recording area $T_1$, and as shown in FIGS. 8 and 9, the register mark rows are selectively recorded for the blank area $T_2$. In Example 4 the register mark rows shown in FIG. 9 are recorded for the magenta plate as a reference, and the register mark rows shown in FIG. 8 are recorded for the other color plates.

EXAMPLE 5

Figure 12:
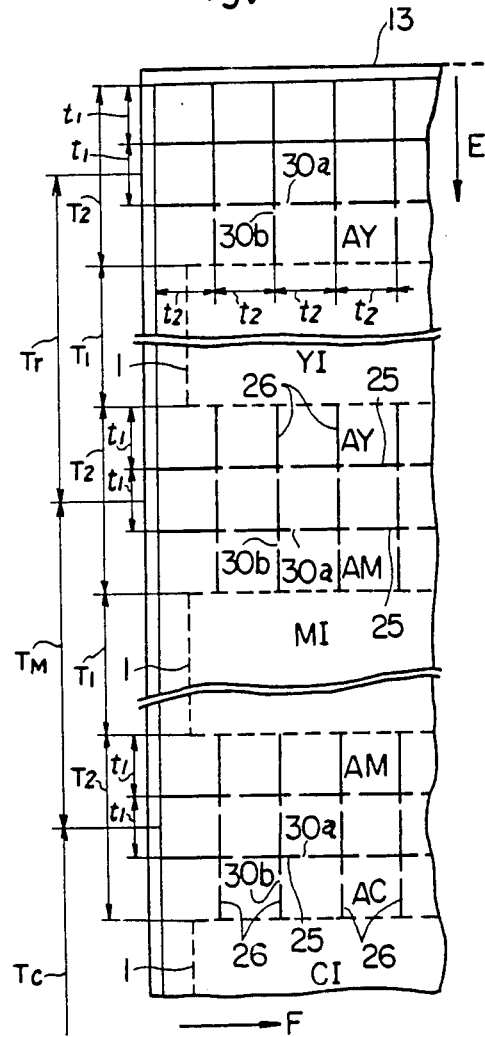
FIG. 12 is a schematic view showing the register marks produced in Example 5.

Referring to FIG. 12, the reference numerals 30a and 30b designate omitted portions, which are differently located in each register mark row with each color separation plate. When the registering is carried out with these register marks, it is not necessary to specify the reference color separation plate, and it is possible to proceed with the registering by selecting either of the register marks with respect to the other as exactly as shown in FIG. 10. As compared with Example 4 shown in FIG. 7, the different location of two omitted portions 30a and 30b facilitates the registering work, particularly that of a plurality of plates. This is the advantage of Example 5.

Figure 13:
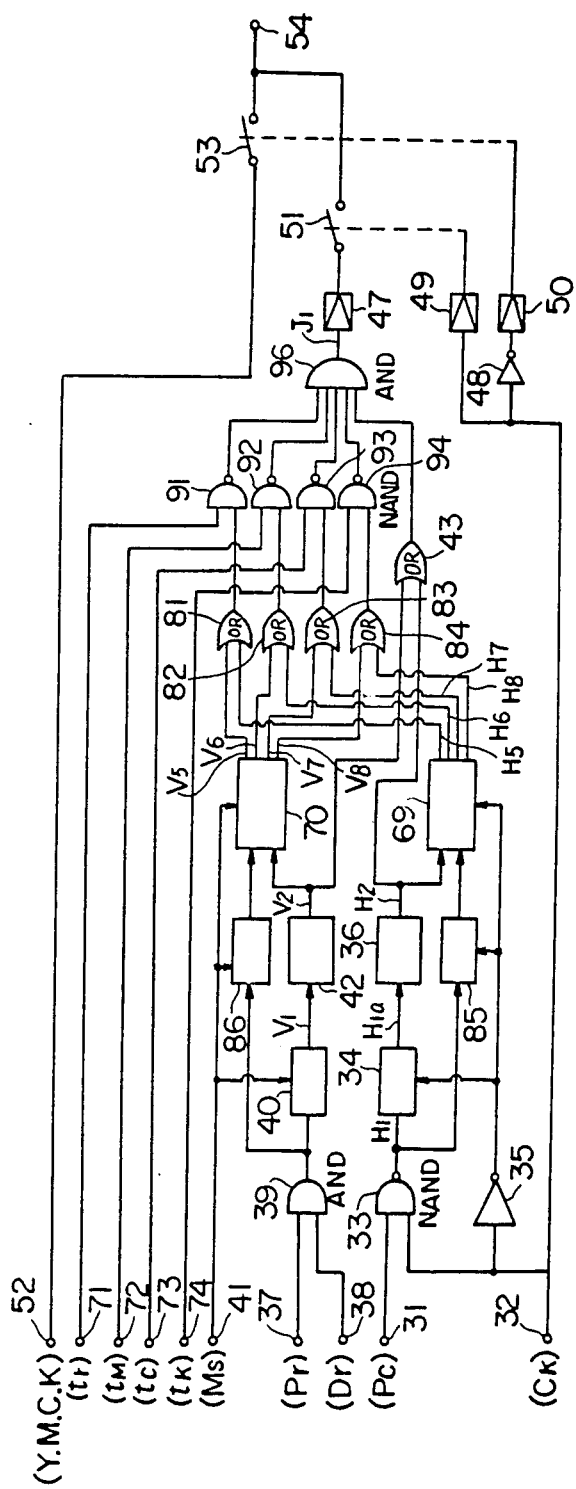
FIG. 13 is a circuit diagram showing a control system for Example 5.
Figure 17:
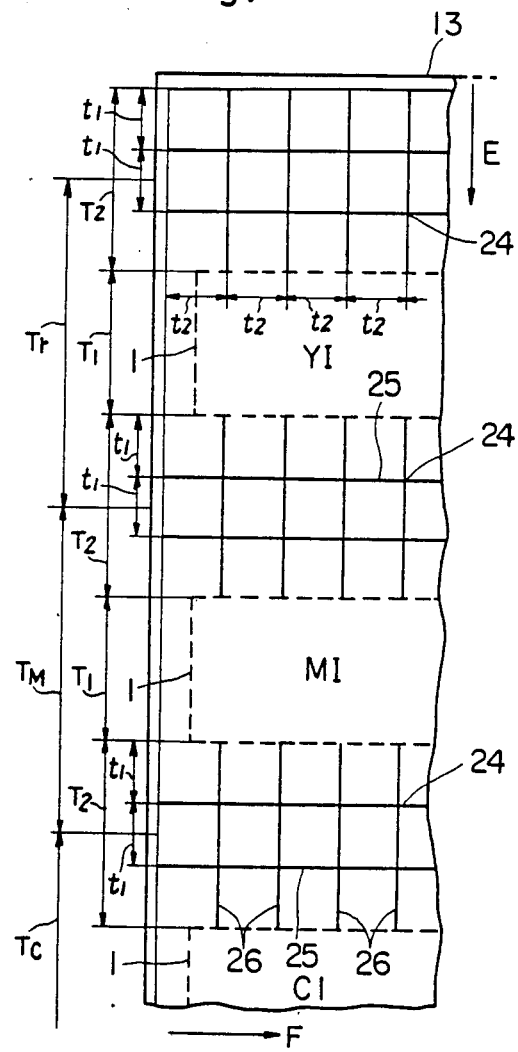
FIG. 17 is a plan view showing a film on which register marks are recorded by exposure under known methods.

Referring to FIG. 13, a circuit used in Example 5 will be described:

In FIG. 13 like reference numerals designate like elements and components to those in FIG. 11, of which a description will be omitted for simplicity. As described above, Example 5 is characterized by the provision of a control means adapted to record the omitted portions 30a and 30b located at different places in each register mark row AY, AM, AC and AK.

The OR circuit 43 outputs the regular register mark signal $(H_2+V_2)$. The output signal $H_1$ from the NAND circuit 33 is input to a counter 85 through which an appropriate integral sub-multiple of frequency (e.g. $\frac{1}{2}$) is obtained so as to use them as clock pulses for the shift register 69. For the shift register 69 a multistage type having a plurality of output terminals in its connection can be effectively employed. The input signal $H_2$ is shifted by the clock pulses thereby to produce four signals $H_5$, $H_6$, $H_7$ and $H_8$ in succession at four output terminals, wherein the four signals $H_5$ to $H_8$ are delayed one after another by a time corresponding to the desired pitch. These four signals $H_5$ to $H_8$ are input to one of the input terminals of each OR circuit 81, 82, 83 and 84. The output signals $H_5$ to $H_8$ from the shift register 69 are to determine the location of the omitted portion 30b in the line 26 (FIG. 12) parallel with the main scanning direction of each color separation plate.

The output signal from the NAND circuit 39 is input to a counter 86 where it is divided into an appropriate number of frequencies (e.g. $\frac{1}{2}$) so as to use them as clock pulses for the shift register 70. For the shift register 70 a multistage type having a plurality of output terminals in its connection can be effectively employed. The input signal $V_2$ is shifted by the clock pulses thereby to produce four signals $V_5$, $V_6$, $V_7$ and $V_8$ in succession at four output terminals, wherein the four signals $V_5$ to $V_8$ are delayed one after another by a time corresponding to the desired pitch. These four signals $V_5$ to $V_8$ are input to the other input terminal of each OR circuit 81, 82, 83 and 84. The output signals $V_5$ to $V_8$ from the shift register 70 are to determine the location of the omitted portion 30a in the line 2 (FIG. 12) parallel with the subscanning direction of each color separation plate.

Each OR circuit 81, 82, 83 and 84 outputs signals $(H_5+V_5)$ to $(H_8+V_8)$, respectively, against the regular register mark signal $(H_2+V_2)$ in the main scanning direction and the subscanning direction, wherein the output signals $(H_5+V_5)$ to $(H_8+V_8)$ are delayed one after another by a time corresponding to the desired pitch, thereby enabling the signals to correspond to the respective color separation plates. These signals are input to one of the input terminals of each NAND circuit 91, 92, 93 and 94.

The terminal 71 receives a signal $t_r$ for the yellow area $T_r$ (FIG. 12), which signal is input to the other input terminal of the NAND circuit 91. The signal $(H_5+V_5)$ is input to the other input signal of the NAND circuit 91 thereby to generate a signal $t_r \cdot (H_5+V_5)$ whereby the recording of register marks for the yellow plate is stopped.

Likewise, the NAND circuit 92 outputs a signal $t_M \cdot (H_6+V_6)$ whereby the recording of register marks for the magenta plate, and the NAND circuit 68 outputs a signal $t_C \cdot (H_7+V_7)$ whereby the recording of register marks for the cyan plate is stopped. The AND circuit 69 outputs a signal $t_K \cdot (H_8+V_8)$ whereby the recording of register marks for the black plate is stopped.

These recording stop signals and the regular register mark signals are combined by way of an AND circuit 96 thereby to output a signal $J_1$. When the signals $t_Y \cdot (H_5+V_5)$ to $t_K \cdot (H_8+V_8)$ are all high, the positive register marks are recorded, and when any of the four signals is low, the output signal $J_1$ becomes low (the recording of the register marks is stopped). As a result the register marks having omitted portions differently located in accordance with the color separation plates are recorded. This signal $J_1$ is output to the output terminal 58 through the amplifier 51 and switch 54. Thereafter, the same procedure as that in Example 4 will be taken, that is, the color separation pictures are recorded for the picture recording area $T_1$, and the register mark rows (FIG. 12) corresponding to the color separation plates are recorded for the blank area of the picture area $T_1$.

The omitted portions 30a, 30b (FIGS. 7 and 12) in the register mark rows are provided at different positions, in different orders and to different lengths, all of which are determined by means of the counters 85 and 86, the shift registers 69 and 70, and by differently constructing the OR circuits 81 to 84, and the NAND circuits 91 to 94, or by arranging the other circuits containing one of the above-mentioned elements.

Throughout the illustrated embodiments the four kinds of color separation pictures YI, MI, CI and KI are arranged in four places around the peripheral surface of the drum, thereby effecting the simultaneous recording of the four pictures, but the present invention is not limited to it. It is possible to record one kind or two kinds of color separation pictures in one process.

The shapes of the register marks can be variously selected other than the cross-shape so far mentioned, such as an L-shape, -shape, -shape, -shape or reversed shapes thereof.

What is claimed is:

1. A method of recording the register marks in a color scanner, the method comprising:
    a first step of producing a first group of picture signals in the cross direction parallel with the subscanning direction, and a second group of picture signals in the grain direction parallel with the main scanning direction, with the use of timing pulses;
    a second step of producing positive linear picture signals by combining the first and second groups of signals;
    a third step of recording by exposure register marks outside the reproducing picture area for the respective color separation picture, the area being hereinafter referred to as the blank area, by using the positive linear picture signals as register mark signals; and
    a fourth step of producing the register mark recording signals by dividing the positive linear picture signals at a desired timing so as to produce omitted portions therein.

2. A method as defined in claim 1, wherein some of the register marks are produced from the positive linear pictures having the omitted portions at desired positions for at least one of the color separation pictures.

3. A method as defined in claims 1 or 2, wherein some of the register marks are produced from the positive linear pictures having the omitted portions located at different positions depending on the color separation pictures.

* * * * *